(12) United States Patent
Huang

(10) Patent No.: US 10,323,799 B2
(45) Date of Patent: Jun. 18, 2019

(54) LIGHT-EMITTING DIODE FILAMENT WITH A HEAT-DISSIPATING STRUCTURE AND LIGHT-EMITTING DIODE FILAMENT LIGHT BULB USING THE SAME

(71) Applicant: Liquidleds Lighting Corp., Taipei (TW)

(72) Inventor: David Huang, Taipei (TW)

(73) Assignee: Liquidleds Lighting Corp., Taipei (TW)

( * ) Notice: Subject to any disclaimer, the term of this patent is extended or adjusted under 35 U.S.C. 154(b) by 0 days.

(21) Appl. No.: 15/714,007

(22) Filed: Sep. 25, 2017

(65) Prior Publication Data

US 2018/0112831 A1   Apr. 26, 2018

(30) Foreign Application Priority Data

Oct. 26, 2016 (TW) .............................. 105134627 A
Dec. 30, 2016 (TW) .............................. 105144112 A

(51) Int. Cl.
*F21K 9/232* (2016.01)
*F21K 9/238* (2016.01)
(Continued)

(52) U.S. Cl.
CPC ............. *F21K 9/232* (2016.08); *F21K 9/238* (2016.08); *F21V 23/002* (2013.01);
(Continued)

(58) Field of Classification Search
CPC .......... F21K 9/20–278; F21Y 2103/10; F21Y 2107/70
See application file for complete search history.

(56) References Cited

U.S. PATENT DOCUMENTS

2004/0008525 A1* 1/2004 Shibata .................. F21K 9/232
313/271
2009/0184618 A1* 7/2009 Hakata ................ H01L 25/0753
313/1
(Continued)

FOREIGN PATENT DOCUMENTS

CN    101194369 A    6/2008
CN    104505455 A    4/2015
(Continued)

OTHER PUBLICATIONS

Japanese Patent Office, Office Action for corresponding application, Japanese Application No. 2017-200135, dated Sep. 28, 2018, 4 pages.
(Continued)

*Primary Examiner* — Sean P Gramling
(74) *Attorney, Agent, or Firm* — C. G. Mersereau; DeWitt LLP

(57) ABSTRACT

A light-emitting diode (LED) filament with a heat-dissipating structure includes multiple LED chips, multiple conductive carriers and a package layer. Each conductive carrier takes the form of a metal sheet and the multiple conductive carriers are spaced apart from each other. Each LED chip is commonly carried by and is electrically connected to two of the multiple conductive carriers adjacent to the LED chip. The package layer covers the multiple LED chips and the multiple conductive carriers with two lateral edge portions of each conductive carrier exposed from the package layer. The LED filament is mounted inside a light bulb. Because the multiple conductive carriers are partially exposed from the package layer, heat generated by the multiple LED chips can be dissipated to an ambient environment without affecting lighting efficiency and light output as a result of accumulated heat.

24 Claims, 10 Drawing Sheets

(51) Int. Cl.
  *F21V 23/00*  (2015.01)
  *H01L 25/075*  (2006.01)
  *F21Y 107/00*  (2016.01)
  *F21Y 115/10*  (2016.01)
  *H01L 33/48*  (2010.01)
  *H01L 33/62*  (2010.01)
  *H01L 33/64*  (2010.01)

(52) U.S. Cl.
  CPC ...... H01L 25/0753 (2013.01); *F21Y 2107/00* (2016.08); *F21Y 2115/10* (2016.08); *H01L 33/48* (2013.01); *H01L 33/62* (2013.01); *H01L 33/647* (2013.01)

(56) References Cited

U.S. PATENT DOCUMENTS

2014/0268779 A1  9/2014  Sorensen et al.
2015/0069442 A1* 3/2015 Liu ....................... H01L 33/504
                  257/98
2015/0348948 A1 12/2015 Andrews et al.

FOREIGN PATENT DOCUMENTS

| | | |
|---|---|---|
| CN | 105570701 A | 5/2016 |
| JP | 200712727 A | 1/2007 |
| JP | 2013243316 A | 12/2013 |
| JP | 2015056667 A | 3/2015 |
| JP | 2015119013 A | 6/2015 |
| WO | WO2015185360 A1 | 12/2015 |

OTHER PUBLICATIONS

Chinese Intellectual Property, Office Action for corresponding application, Chinese Application No. 201710061255.2, dated Mar. 1, 2019, 8 pages.

* cited by examiner

US 10,323,799 B2

LIGHT-EMITTING DIODE FILAMENT WITH A HEAT-DISSIPATING STRUCTURE AND LIGHT-EMITTING DIODE FILAMENT LIGHT BULB USING THE SAME

BACKGROUND OF THE INVENTION

1. Field of the Invention

The present invention relates to a filament and, more particularly, to a light-emitting diode (LED) filament with a heat-dissipating structure and an LED filament light bulb using the same.

2. Description of the Related Art

Rapid development of lighting technology gives rise to a variety of LED lighting products. A kind of vintage light bulb simulating incandescent light bulbs has been introduced to the lighting market recently. Such vintage light bulb includes one or more LED filaments mounted inside a light bulb and exhibiting the effect of the filament in a conventional incandescent light bulb to render the vintage light bulb with a retro look.

With reference to FIGS. 8 and 9, a conventional LED filament 90 includes multiple LED chips 91, multiple conductive carriers 92 and a package layer 93. Each LED chip 91 is commonly supported by and is electrically connected in series to two of the multiple conductive carriers 92 adjacent to the LED chip 92, such that the multiple LED chips 91 and the multiple conductive carriers 92 can be alternately arranged. The LED filament 90 ends up with the shape of a long string by using the package layer 93 to enclose the multiple LED chips 91 and the multiple conductive carriers 92 therein. However, heat generated by the multiple LED chips 91 during a light-emitting process gets accumulated inside the package layer 93 and fails to be effectively dissipated due to the enclosure of the package layer 93, and lighting efficiency of the multiple LED chips 91 deteriorates and lighting luminance is lowered for the sake of the accumulated heat.

SUMMARY OF THE INVENTION

An objective of the present invention is to provide a light-emitting diode (LED) filament and an LED filament light bulb using the same enhancing a lighting efficiency and light output thereof with a heat-dissipating structure of the LED filament.

To achieve the foregoing objective, the LED filament with a heat-dissipating structure includes multiple LED chips, multiple conductive carriers and a package layer.

The multiple conductive carriers are spaced apart from each other. Each conductive carrier takes the form of a metal sheet. Each LED chip is commonly carried and supported by and is electrically connected to two of the multiple conductive carriers adjacent to the LED chip.

The package layer is transparent and is mounted on the multiple conductive carriers to cover the multiple LED chips with two lateral edge portions of each conductive carrier exposed from the package layer to form an elongated first LED string in a longitudinal direction.

Each conductive carrier has a first width. Each package layer has a second width. The first width is greater than the second width.

According to the foregoing structure of the LED filament, the lateral edge portions of the multiple conductive carriers of the LED filament are exposed from the package layer, such that heat generated by the multiple LED chips can be dissipated to an ambient environment outside the LED filament through the multiple conductive carriers to improve the lighting efficiency and light output of the multiple LED chips.

To achieve the foregoing object, the LED filament light bulb includes a foregoing LED filament, a seal glass bulb, a base, and an insulating mount.

The seal glass bulb has a receiving space defined therein.

The base has an electrical foot contact and a screw thread contact electrically respectively connected to two of the multiple conductive carriers of the LED filament at two opposite ends of the LED filament.

The insulating mount is formed on a top of the base and is mounted inside the receiving space of the seal glass bulb with the LED filament mounted on the insulating mount.

According to the foregoing structure of the LED filament light bulb, The multiple conductive carriers of the LED filament are partially exposed from the package layer, such that heat generated by the LED chips when staying lit is transferred to the receiving space of the seal glass bulb and is then dissipated to an ambient environment outside the LED filament light bulb through the seal glass bulb. Thus, the heat generated by the LED chips won't be accumulated inside the respective package layer to enhance lighting efficiency and light output of the LED light board.

Other objectives, advantages and novel features of the invention will become more apparent from the following detailed description when taken in conjunction with the accompanying drawings.

DETAILED DESCRIPTION OF THE INVENTION

Figure 1:
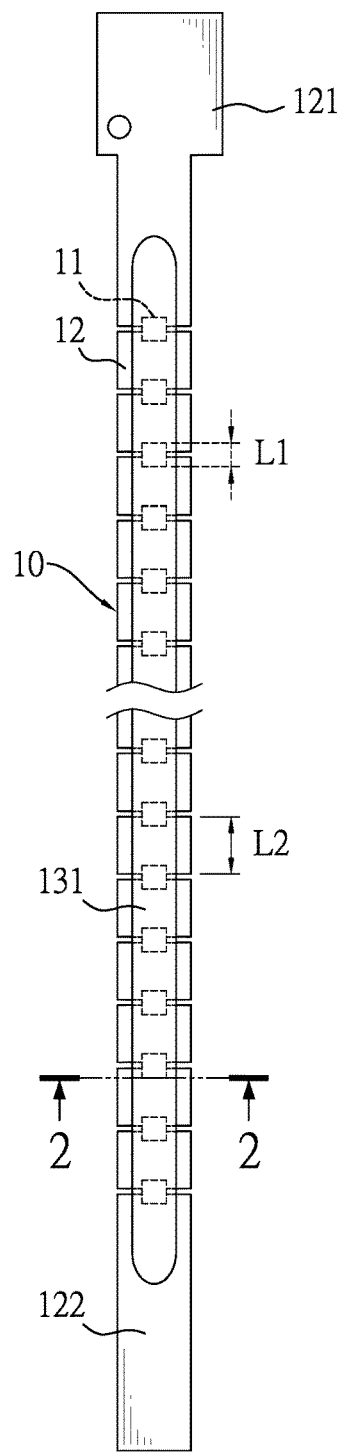
FIG. 1 is a top view of a first embodiment of an LED filament in accordance with the present invention.
Figure 2:
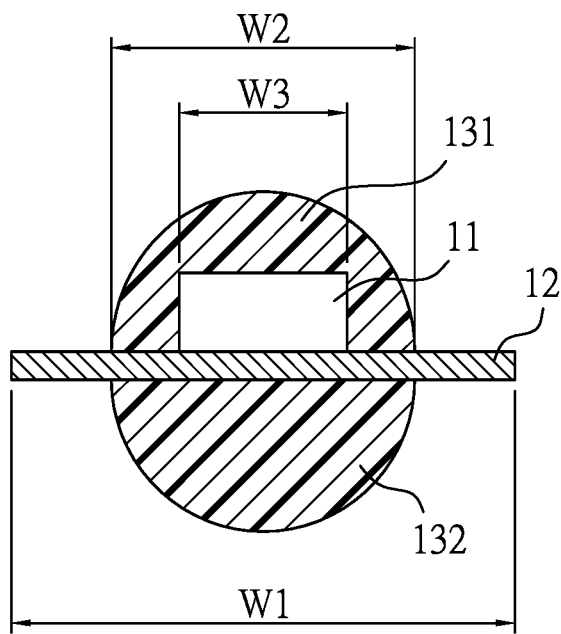
FIG. 2 is an enlarged cross-sectional view of the LED filament taken along line 2-2 in FIG. 1.

With reference to FIGS. 1 and 2, a light-emitting diode (LED) filament with a heat-dissipating structure in accordance with the present invention takes the form of an elongated string in a longitudinal direction, is flexible, and includes multiple LED chips 11, multiple conductive carriers 12 and a package layer to constitute a first LED string 10.

Each LED chip 11 is electrically connected in series to and is commonly carried and supported by two of the multiple conductive carriers 12 adjacent to the LED chip 11 and spaced apart from each other, and has a positive terminal and a negative terminal electrically connected to the respective two conductive carriers 12 adjacent to the LED chip 11.

The package layer is transparent and is mounted on the multiple conductive carriers 12 to cover the multiple LED chips 11 with two lateral edge portions of each conductive carrier 12 exposed from the package layer. In the present embodiment, the package layer includes a top package layer 131 and a bottom package layer 132. The top package layer 131 is mounted on top surfaces of the multiple conductive carriers 12, covers the multiple LED chips 11, and leaves left edge portions and right edge portions of the multiple conductive carriers 12 exposed from the top package layer 131. The bottom package layer 132 is mounted on bottom surfaces of the multiple conductive carriers 12 to correspond to the top package layer 131 in position. Likewise, the left edge portions and the right edge portions of the multiple conductive carriers 12 are also exposed from the bottom package layer 132. The top package layer 131 and the bottom package layer 132 are used to protect the multiple LED chips 11 and the multiple conductive carriers 12 and enhance the bonding strength between the multiple LED chips 11 and the multiple conductive carriers 12. In the present embodiment, the top package layer 131 and the bottom package layer 132 are formed by using a transparent resin material, a transparent silicone material, or a transparent polymer material through a process of injection molding.

The first LED string 10 further has a first conducting portion 121 and a second conducting portion 122. The first conducting portion 121 is formed on and protrudes upwards from a highest one of the multiple conductive carriers 12. The second conducting portion 122 is formed on and protrudes downwards from a lowest one of the multiple conductive carriers 12. The first conducting portion 121 and the second conducting portion 122 serve as a pair of electrical conductors when the first LED string 10 is mounted inside a light bulb.

Each conductive carrier 12 takes the form of a metal sheet. To allow the first LED string 10 to be bendable, the conductive carrier 12 may be formed by a copper foil, an aluminum foil, a silver foil, a gold foil, an alloy of a combination of the foregoing metals, or an electroplated metal material with good heat dissipation and electrical conductance.

For assurance of optimal heat-dissipating effect, the left edge portions and the right edge portions of the multiple conductive carriers 12 are exposed from the top package layer 131 and the bottom package layer 132 to make a heat-dissipating area available as large as possible, thereby enhancing the heat-dissipating effect.

Each LED chip 11 has a first length L1. Each conductive carrier 12 has a second length L2. The second length L2 is greater than the first length L1, such that the multiple conductive carriers 12 can provide a sufficient surface area when the multiple LED chips 11 are mounted on the respective conductive carriers 12 for the first LED string 10 to have a sufficient length to adapt to different forms as the first LED string 10 is bent or folded, preventing the multiple LED chips 11 from being separated from the multiple conductive carriers 12 for enhancement of bonding strength between the multiple LED chips 11 and the multiple conductive carriers 12.

Each conductive carrier 12 has a first width W1. Each of the top package layer 131 and the bottom package layer 132 has an equal second width W2. Each LED chip 11 has a third width W3. The first width W1 is greater than the second width W2 and the third width W3, such that the multiple conductive carriers 12 can provide a sufficient width for the multiple LED chips 11 to be carried thereon and a sufficient area exposed from the top package layer 131 and the bottom package layer 132 for an enhanced and effective heat-dissipating effect that heat generated by the multiple LED chips 11 won't be accumulated inside the top package layer 131 and the bottom package layer 132.

Figure 3:
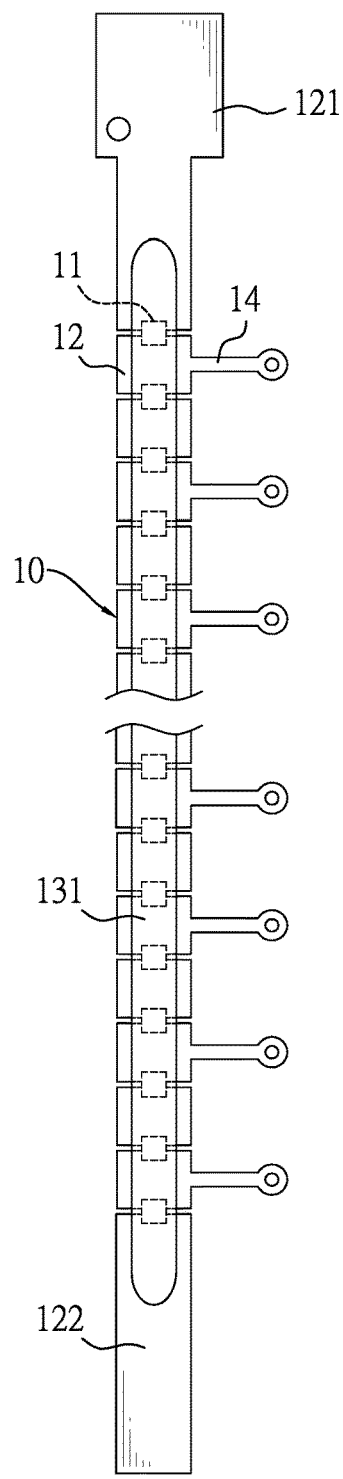
FIG. 3 is a top view of a second embodiment of an LED filament in accordance with the present invention.

With reference to FIG. 3, a second embodiment of an LED filament with a heat-dissipating structure in accordance with the present invention differs from the first embodiment in additionally having multiple support arms 14. The multiple support arms 14 are formed on and protrude laterally from left sides or right sides of every other conductive carrier 12. In the present embodiment, the multiple support arms 14 are formed on positions including but not limited to the right sides on every other conductive carrier 12. The multiple support arms 14 serve as a support means or a coupling means when the first LED string 10 is mounted inside a light bulb to increase the capability of fixing and supporting the first LED string 10. The multiple support arms 14 may take the form of a lug terminal or any other form with supporting capability depending on actual mounting requirement of the first LED string 10 inside a light bulb.

Figure 4:
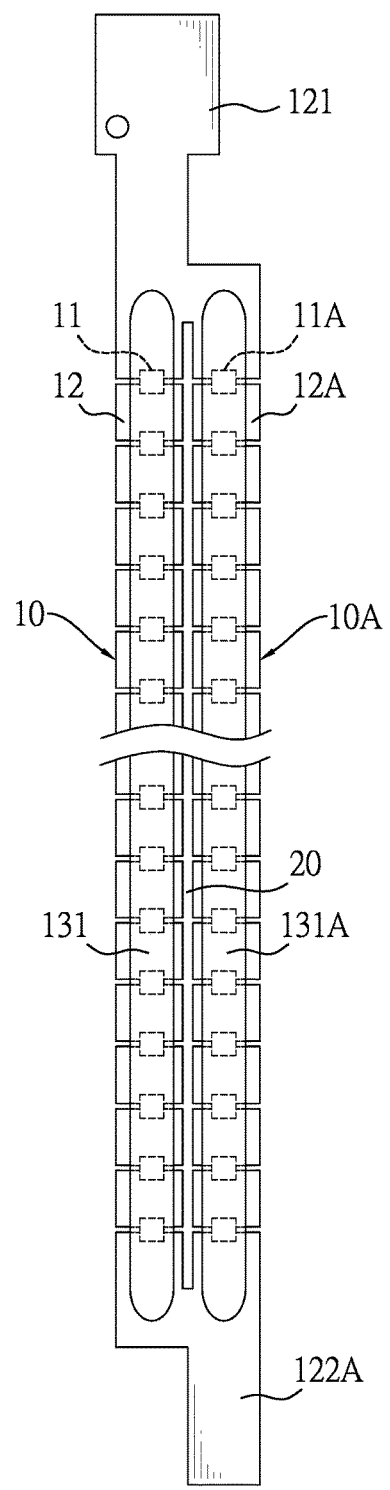
FIG. 4 is a top view of a third embodiment of an LED filament in accordance with the present invention.

With reference to FIG. 4, a third embodiment of an LED filament with a heat-dissipating structure in accordance with the present invention differs from the first embodiment in additionally having a second LED string 10A. The second LED string 10A is connected with the first LED string 10 with an isolation slot 20 formed between the first LED string 10 and the second LED string 10A for the first LED string 10 and the second LED string 10A to be spaced apart from each other. In the present embodiment, the first LED string 10 has a first conducting portion 121 and the second LED string 10A has a second conducting portion 122A. The first conducting portion 121 is formed on and protrudes upwards from a highest one of the multiple conductive carriers 12 of the first LED string 10. The second conducting portion 122A is formed on and protrudes downwards from a lowest one of the multiple conductive carriers 12 of the second LED string 10A. The first conducting portion 121 and the second conducting portion 122A serve as a pair of electrical conductors when the first LED string 10 and the second LED string 10A are mounted inside a light bulb.

The second LED string 10A includes multiple LED chips 11A, multiple conductive carriers 12A and a package layer, which are structurally similar to the multiple LED chips 11, the multiple conductive carriers 12 and the package layer of the first LED string 10. The materials of forming the multiple LED chips 11A, the multiple conductive carriers 12A and the package layer of the second LED string 10A are identical to those of the first LED string 10.

The highest one of the multiple conductive carriers 12 of the first LED string 10 and the highest one of the multiple conductive carriers 12 of the first LED string 10 are connected. The lowest one of the multiple conductive carriers 12 of the first LED string 10 and the lowest one of the multiple conductive carriers 12 of the first LED string 10 are connected.

Figure 5:
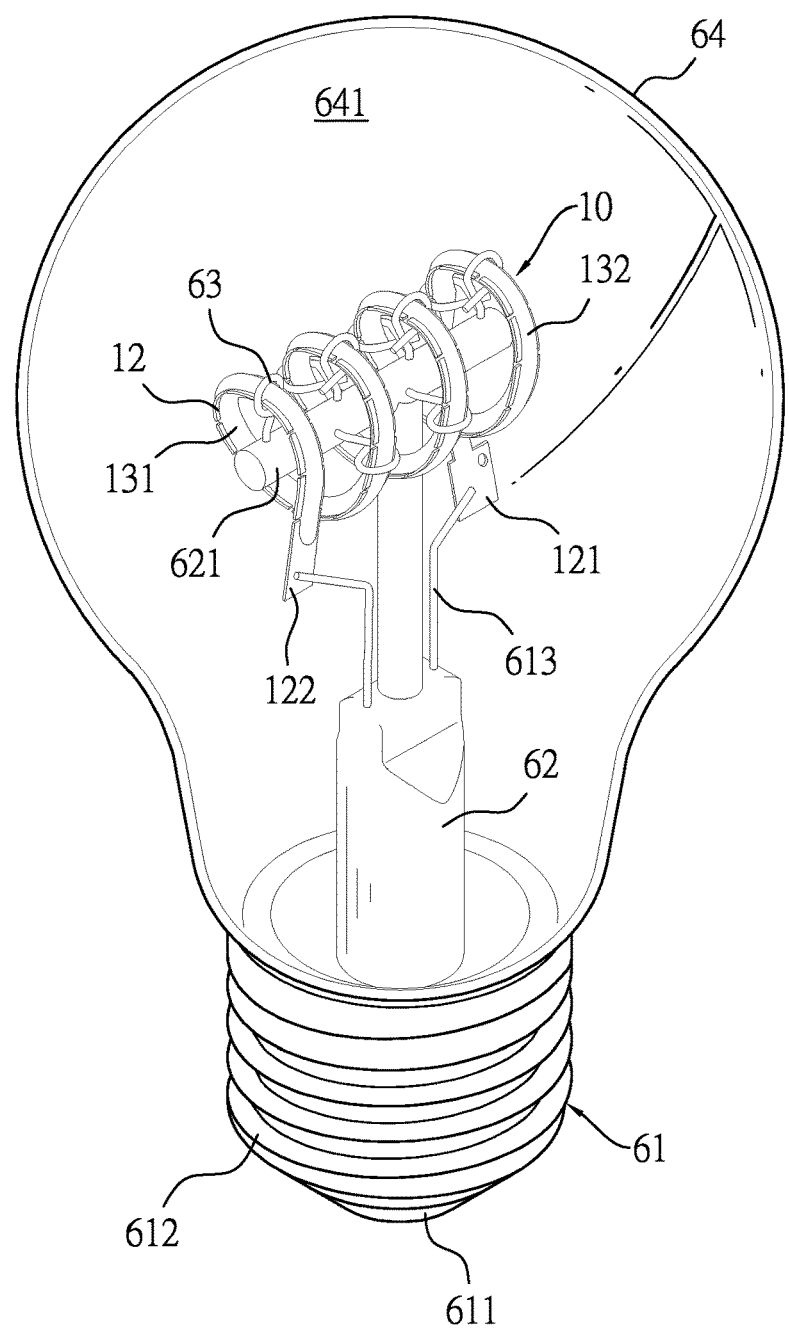
FIG. 5 is a perspective view of a first embodiment of an LED filament light bulb in accordance with the present invention.

With reference to FIG. 5, the first embodiment of the LED filament mounted inside an LED filament light bulb as illustrated is described as follows.

The LED filament light bulb includes a base 61, an insulating mount 62, the foregoing first LED string 10, multiple tie wires 63 and a seal glass bulb 64.

The base 61 has an electrical foot contact 611 and a screw thread contact 612. The electrical foot contact 611 is formed on a bottom of the base 61. The screw thread contact 612 is formed around a peripheral wall of the base 61. The electrical foot contact 611 and the screw thread contact 612 are used to electrically connect to an external power source. In the present embodiment, the electrical foot contact 611 and the screw thread contact 612 are respectively connected to a positive electrode and a negative electrode of the external power source.

The insulating mount 62 is formed on a top of the base 61. In the present embodiment, the insulating mount 62 is made of glass and has a mounting support 621. The mounting support 621 is T-shaped with a horizontal portion and a vertical portion formed on and protruding downwards from a bottom of the horizontal portion. The first LED string 10 is wound around the horizontal portion of the mounting support 621 and is electrically connected to the electrical foot contact 611 and the screw thread contact 612. In the present embodiment, two connecting pins 613 are respectively connected to the electrical foot contact 611 and the screw thread contact 612 and are mounted through the insulating mount 62 to electrically connect to the first conducting portion 121 and the second conducting portion 122.

One end of each tie wire 63 is wound around and is tied on the first LED string 10 and the other end of the tie wire 63 is securely mounted in the horizontal portion of the mounting support 621 to fix and support the first LED string 10, such that the first LED string 10 is helically mounted around the horizontal portion of the mounting support 621 to cast light omnidirectionally. Therefore, the LED filament light bulb in accordance with the present invention has an omnidirectional lighting effect. The multiple tie wires 63 can be tied on the LED filament 100 in different winding patterns.

The seal glass bulb 64 is mounted on the top of the base 61 and has a receiving space 641 to accommodate the insulating mount 62, the first LED string 10 and the multiple tie wires 63.

As the multiple conductive carriers 12 of the first LED string 10 are partially exposed from the package layer, when the multiple LED chips 11 of the first LED string 10 emit light, heat generated by the multiple LED chips 11 is transferred to the receiving space 641 through the multiple conductive carriers 12 and is further transferred to an ambient environment outside the LED filament light bulb through the seal glass bulb 64. As a result of heat continuously generated when the multiple LED chips 11 stay lit not accumulated inside the package layer, lighting efficiency of the first LED string 10 is enhanced and light output is increased.

Figure 6A:
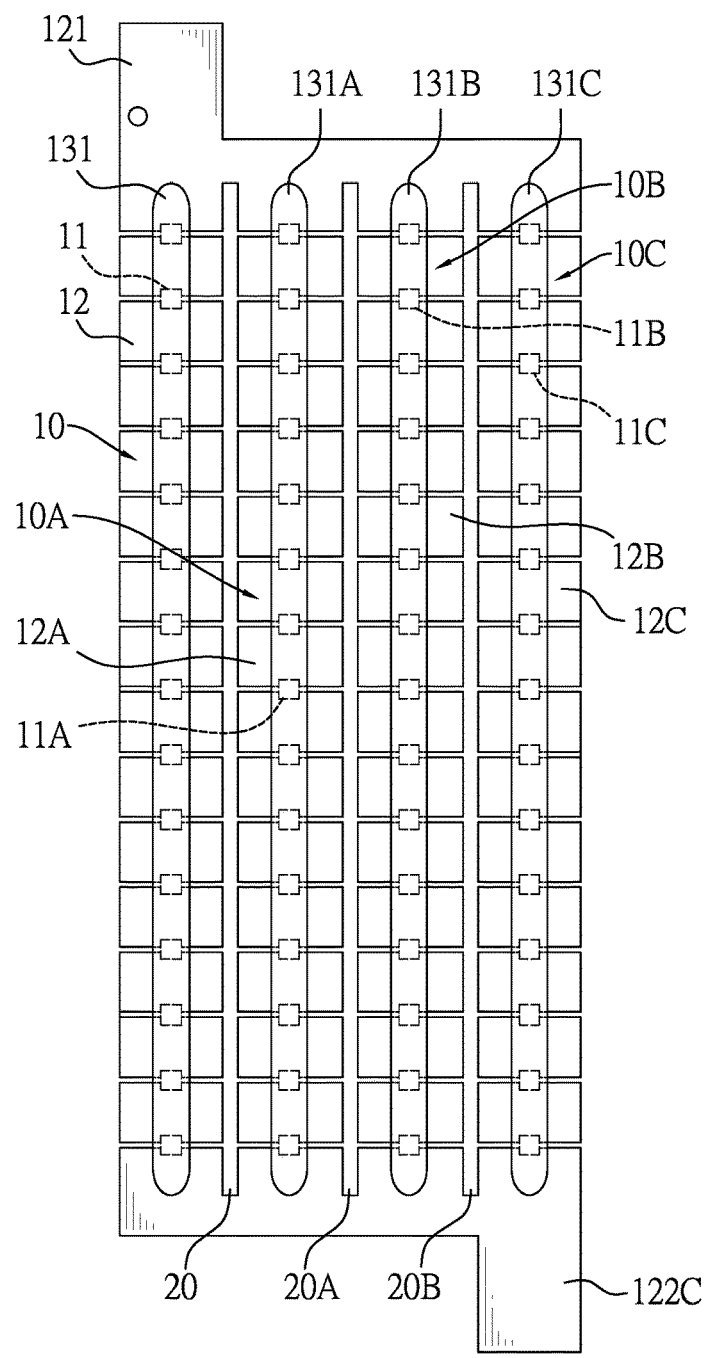
FIG. 6A is a top view of a fourth embodiment of an LED filament in accordance with the present invention.
Figure 6B:
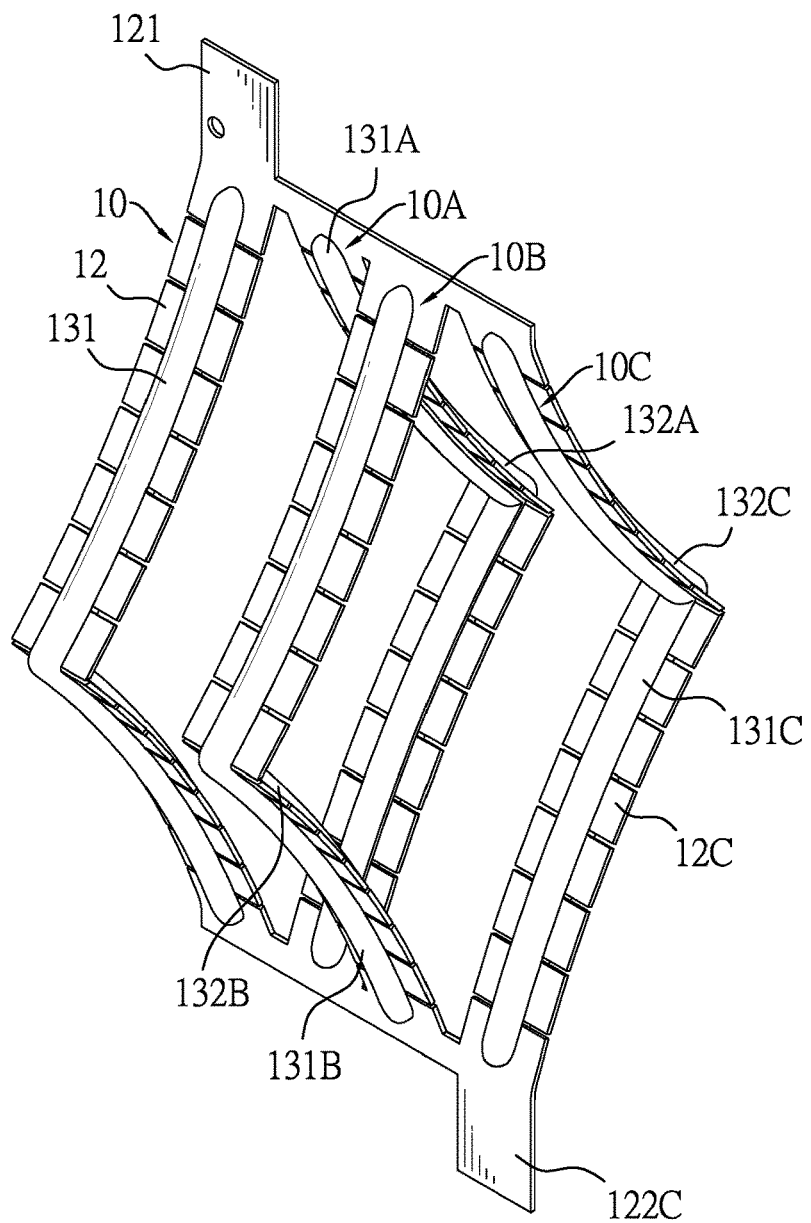
FIG. 6B is a perspective view of the LED filament in FIG. 6A.

With reference to FIGS. 6A and 6B, a fourth embodiment of an LED filament with a heat-dissipating structure in accordance with the present invention differs from the third embodiment in additionally having a third LED string 10B and a fourth LED string 10C. The third LED string 10B and the fourth LED string 10C are connected with the first LED string 10 and the second LED string 10A. There are two additional isolation slots 20A, 20B respectively formed between the second LED string 10A and the third LED string 10B and between the third LED string 10B and the fourth LED string 10C for the second LED string 10A, the third LED string 10B, and the fourth LED string 10C to be spaced apart from one another. In the present embodiment, the first LED string 10 has the first conducting portion 121 formed thereon, and the fourth LED string 10C has the second conducting portion 122C formed thereon to pair with the first conducting portion 121.

Each of the third LED string 10B and the fourth LED string 10C includes multiple LED chips 11B, 11C, multiple conductive carriers 12B, 12C and a package layer, which are structurally similar to the multiple LED chips 11, 11A, the multiple conductive carriers 12, 12A and the package layer of each of the first LED string 10 and the second LED string 10A. The materials of forming the multiple LED chips 11B, 11C, the multiple conductive carriers 12B, 12C and the package layer of each of the third LED string 10B and the fourth LED string 10C are identical to those of each of the first LED string 10 and the second LED string 10A. To keep description associated with the fourth embodiment concise, structural description of the present embodiment similar to that of the foregoing embodiments is not elaborated here.

The highest ones of the multiple conductive carriers 11, 11A, 11B, 11C of the first LED string 10, the second LED string 10A, the third LED string 10B and the fourth LED string 10C are connected, and the lowest ones of the multiple conductive carriers 11, 11A, 11B, 11C of the first LED string 10, the second LED string 10A, the third LED string 10B and the fourth LED string 10C are connected, to constitute an LED light board.

In the present embodiment, because of the isolation slot 20 between the first LED string 10 and the second LED string 10A, the isolation slot 20A between the second LED string 10A and the third LED string 10B, and the isolation slot 20B between the third LED string 10B and the fourth LED string 10C as well as the multiple conductive carriers 12, 12A, 12B, 12C arranged at intervals, the first LED string 10, the second LED string 10A, the third LED string 10B and the fourth LED string 10C can be spread out to take the form including but not limited to a rhombus. Alternatively, the first LED string 10, the second LED string 10A, the third LED string 10B and the fourth LED string 10C may be spread out to take the form of a sphere for the LED light board to have a broader lighting range. Besides, a space defined within the first LED string 10, the second LED string 10A, the third LED string 10B and the fourth LED string 10C when the first LED string 10, the second LED string 10A, the third LED string 10B and the fourth LED string 10C are spread out renders heat generated inside the space an effect of convection to effectively dissipate the heat and enhance heat-dissipating efficacy.

Figure 7:
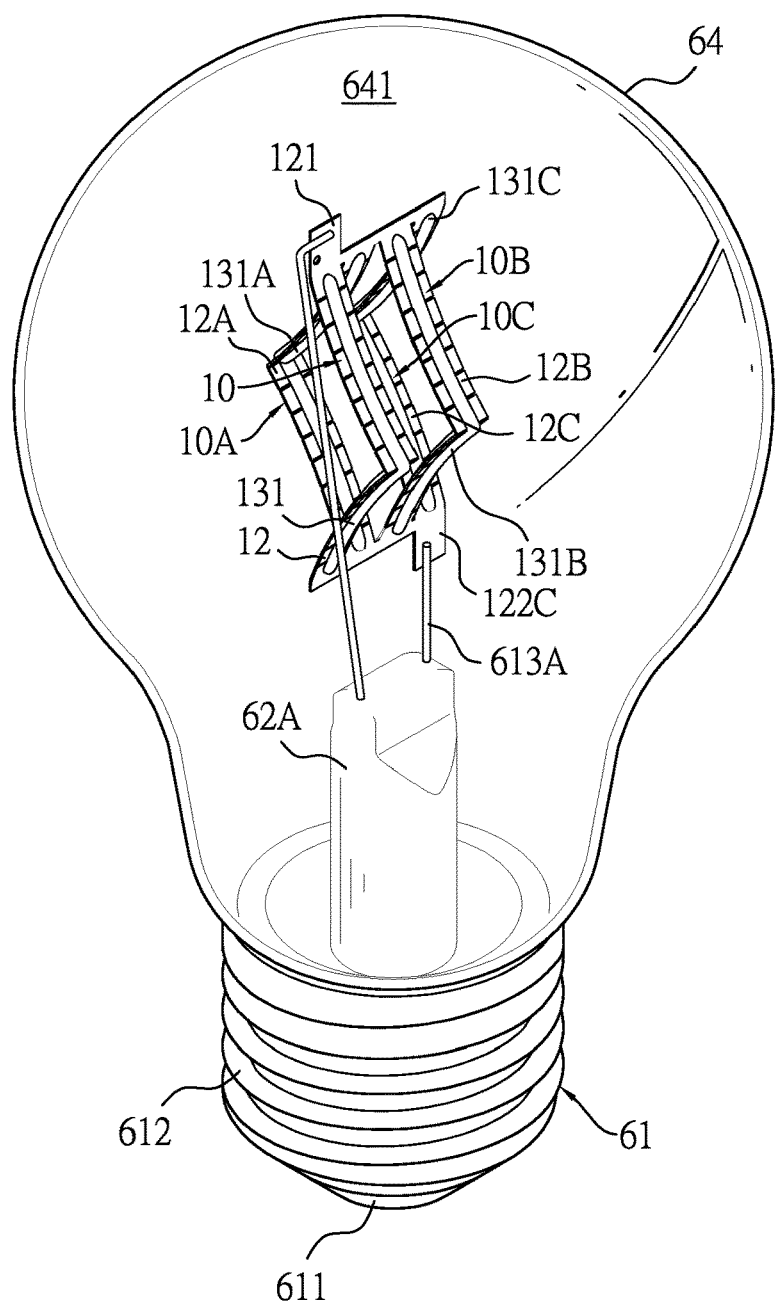
FIG. 7 is a perspective view of a second embodiment of an LED filament light bulb in accordance with the present invention.
Figure 8:
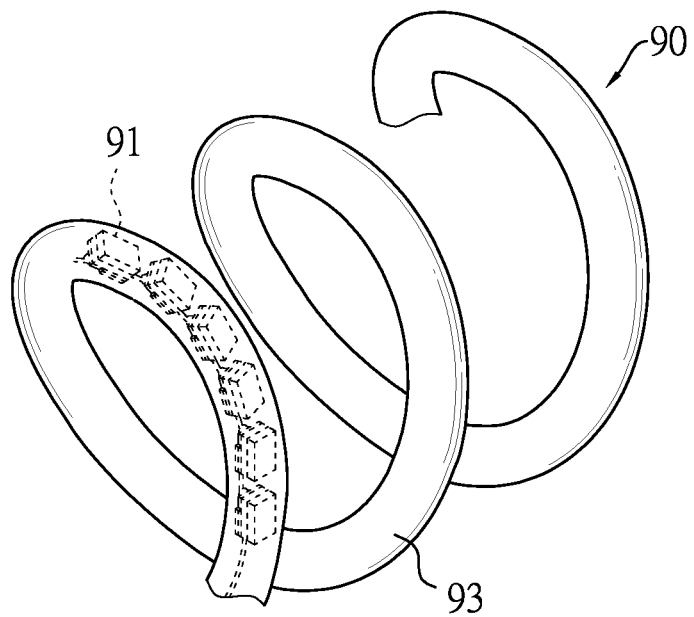
FIG. 8 is a schematic view of a conventional LED filament.
Figure 9:
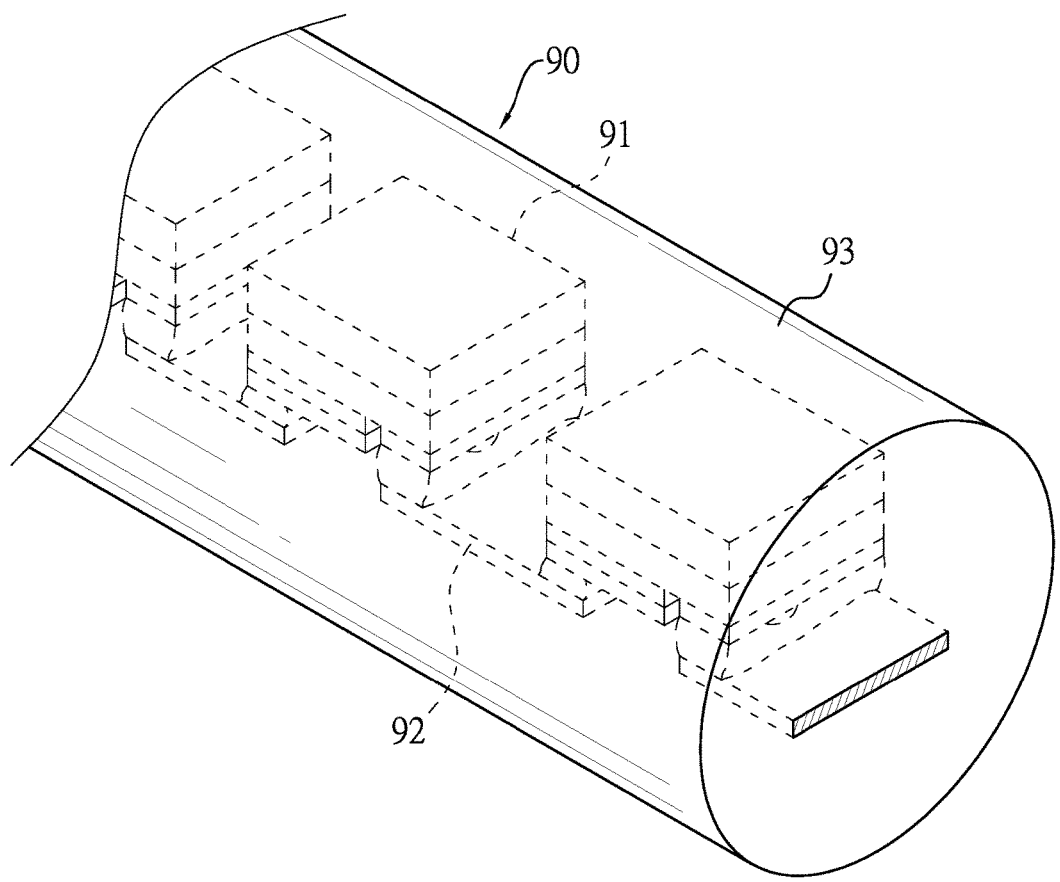
FIG. 9 is a partially enlarged schematic view of the conventional LED filament in FIG. 8.

With reference to FIG. 7, a second embodiment of an LED filament light bulb in accordance with the present invention differs from the first embodiment in that the foregoing LED light board associated with the fourth embodiment of the LED filament is mounted inside the LED filament light bulb.

The LED light board is mounted on a top of the insulating mount 62A and is spread out to take the form of a rhombus in generation of a broader lighting range and an omnidirectional lighting effect. The first conducting portion 121 and the second conducting portion 122C are electrically respectively connected to the electrical foot contact 611 and the screw thread contact 612 through two connecting pins 613A mounted in the insulating mount 62A and connected to the first conducting portion 121 and the second conducting portion 122C.

The receiving space 641 inside the seal glass bulb 62 serves to accommodate the insulating mount 62 and the LED light board.

The multiple conductive carriers 12, 12A, 12B, 12C of the first LED string 12, the second LED string 12A, the third LED string 12B and the fourth LED string 12C are partially exposed from the respective package layers, such that heat generated by the LED chips 11, 11A, 11B, 11C when staying lit is transferred to the receiving space 641 of the seal glass bulb 64 and is then dissipated to an ambient environment outside the LED filament light bulb through the seal glass bulb 64. Thus, the heat generated by the LED chips 11, 11A, 11B, 11C won't be accumulated inside the respective package layer to enhance lighting efficiency of the LED light board and increase light output.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A light-emitting diode (LED) filament with a heat-dissipating structure, comprising:
   multiple LED chips;
   multiple conductive carriers spaced apart from each other, each conductive carrier taking the form of a metal sheet made of copper or copper alloy, wherein each LED chip is commonly carried and supported by and is electrically connected to two of the multiple conductive carriers adjacent to the LED chip; and
   a package layer being transparent and mounted on the multiple conductive carriers to cover the multiple LED chips with each conductive carrier exposed from the package layer to form a flexible first LED string;
   wherein each conductive carrier has a first width, each package layer has a second width, and the first width is greater than the second width, and heat generated by the multiple LED chips is dissipated out of the package layer through the multiple conductive carriers.

2. The LED filament as claimed in claim 1, wherein the package layer includes a top package layer mounted on top surfaces of the multiple conductive carriers and covering the multiple LED chips.

3. The LED filament as claimed in claim 2, wherein the package layer further has a bottom package layer mounted on bottom surfaces of the multiple conductive carriers.

4. The LED filament as claimed in claim 3, wherein left edge portions and right edge portions of the multiple conductive carriers are exposed from the top package layer and the bottom package layer.

5. The LED filament as claimed in claim 4, further comprising multiple support arms formed on and protruding laterally from left sides or right sides of every other conductive carrier.

6. The LED filament as claimed in claim 4, further comprising a second LED string, wherein highest ones of the multiple conductive carriers of the first LED string and the second LED string are connected, lowest ones of the multiple conductive carriers of the first LED string and the second LED string are connected, and an isolation slot is formed between the first LED string and the second LED string for the first LED string and the second LED string to be spaced apart from each other.

7. The LED filament as claimed in claim 4, further comprising multiple LED strings, wherein highest ones of the multiple conductive carriers of the multiple LED strings are connected, and lowest ones of the multiple conductive carriers of the multiple LED strings are connected.

8. The LED filament as claimed in claim 7, where an isolation slot is formed between each adjacent two of the multiple LED strings for the two adjacent LED strings to be spaced apart from each other.

9. A light-emitting diode (LED) filament light bulb, comprising:
   the LED filament as claimed in claim 1;
   a seal glass bulb having a receiving space defined therein;
   a base having an electrical foot contact and a screw thread contact electrically respectively connected to two of the multiple conductive carriers of the LED filament at two opposite ends of the LED filament; and
   an insulating mount formed on a top of the base and mounted inside the receiving space of the seal glass bulb with the LED filament mounted on the insulating mount.

10. A light-emitting diode (LED) filament light bulb, comprising:
    the LED filament as claimed in claim 2;
    a seal glass bulb having a receiving space defined therein;
    a base having an electrical foot contact and a screw thread contact electrically respectively connected to two of the multiple conductive carriers of each LED string of the LED filament at two opposite ends of the LED string; and
    an insulating mount formed on a top of the base and mounted inside the receiving space of the seal glass bulb with the LED filament mounted on the insulating mount.

11. A light-emitting diode (LED) filament light bulb, comprising:
    the LED filament as claimed in claim 3;
    a seal glass bulb having a receiving space defined therein;
    a base having an electrical foot contact and a screw thread contact electrically respectively connected to two of the multiple conductive carriers of each LED string of the LED filament at two opposite ends of the LED string; and
    an insulating mount formed on a top of the base and mounted inside the receiving space of the seal glass bulb with the LED filament mounted on the insulating mount.

12. A light-emitting diode (LED) filament light bulb, comprising:
    the LED filament as claimed in claim 4;
    a seal glass bulb having a receiving space defined therein;
    a base having an electrical foot contact and a screw thread contact electrically respectively connected to two of the multiple conductive carriers of each LED string of the LED filament at two opposite ends of the LED string; and
    an insulating mount formed on a top of the base and mounted inside the receiving space of the seal glass bulb with the LED filament mounted on the insulating mount.

13. A light-emitting diode (LED) filament light bulb, comprising:
    the LED filament as claimed in claim 5;
    a seal glass bulb having a receiving space defined therein;
    a base having an electrical foot contact and a screw thread contact electrically respectively connected to two of the multiple conductive carriers of each LED string of the LED filament at two opposite ends of the LED string; and an insulating mount formed on a top of the base and mounted inside the receiving space of the seal glass bulb with the LED filament mounted on the insulating mount.

14. A light-emitting diode (LED) filament light bulb, comprising:
the LED filament as claimed in claim 6;
a seal glass bulb having a receiving space defined therein;
a base having an electrical foot contact and a screw thread contact electrically respectively connected to two of the multiple conductive carriers of each LED string of the LED filament at two opposite ends of the LED string; and
an insulating mount formed on a top of the base and mounted inside the receiving space of the seal glass bulb with the LED filament mounted on the insulating mount.

15. A light-emitting diode (LED) filament light bulb, comprising:
the LED filament as claimed in claim 7;
a seal glass bulb having a receiving space defined therein;
a base having an electrical foot contact and a screw thread contact electrically respectively connected to two of the multiple conductive carriers of each LED string of the LED filament at two opposite ends of the LED string; and
an insulating mount formed on a top of the base and mounted inside the receiving space of the seal glass bulb with the LED filament mounted on the insulating mount.

16. A light-emitting diode (LED) filament light bulb, comprising:
the LED filament as claimed in claim 8;
a seal glass bulb having a receiving space defined therein;
a base having an electrical foot contact and a screw thread contact electrically respectively connected to two of the multiple conductive carriers of each LED string of the LED filament at two opposite ends of the LED string; and
an insulating mount formed on a top of the base and mounted inside the receiving space of the seal glass bulb with the LED filament mounted on the insulating mount.

17. The LED filament light bulb as claimed in claim 9, wherein each of the electrical foot contact and the screw thread contact has a connecting pin, and the electrical foot contact and the screw thread contact are electrically connected to two respective conductive carriers of the LED filament at two opposite ends of the LED filament through the two respective connecting pins.

18. The LED filament light bulb as claimed in claim 10, wherein each of the electrical foot contact and the screw thread contact has a connecting pin, and the electrical foot contact and the screw thread contact are electrically connected to two respective conductive carriers of each LED string of the LED filament at two opposite ends of the LED string through the two respective connecting pins.

19. The LED filament light bulb as claimed in claim 11, wherein each of the electrical foot contact and the screw thread contact has a connecting pin, and the electrical foot contact and the screw thread contact are electrically connected to two respective conductive carriers of each LED string of the LED filament at two opposite ends of the LED string through the two respective connecting pins.

20. The LED filament light bulb as claimed in claim 12, wherein each of the electrical foot contact and the screw thread contact has a connecting pin, and the electrical foot contact and the screw thread contact are electrically connected to two respective conductive carriers of each LED string of the LED filament at two opposite ends of the LED string through the two respective connecting pins.

21. The LED filament light bulb as claimed in claim 13, wherein each of the electrical foot contact and the screw thread contact has a connecting pin, and the electrical foot contact and the screw thread contact are electrically connected to two respective conductive carriers of each LED string of the LED filament at two opposite ends of the LED string through the two respective connecting pins.

22. The LED filament light bulb as claimed in claim 14, wherein each of the electrical foot contact and the screw thread contact has a connecting pin, and the electrical foot contact and the screw thread contact are electrically connected to two respective conductive carriers of each LED string of the LED filament at two opposite ends of the LED string through the two respective connecting pins.

23. The LED filament light bulb as claimed in claim 15, wherein each of the electrical foot contact and the screw thread contact has a connecting pin, and the electrical foot contact and the screw thread contact are electrically connected to two respective conductive carriers of each LED string of the LED filament at two opposite ends of the LED string through the two respective connecting pins.

24. The LED filament light bulb as claimed in claim 16, wherein each of the electrical foot contact and the screw thread contact has a connecting pin, and the electrical foot contact and the screw thread contact are electrically connected to two respective conductive carriers of each LED string of the LED filament at two opposite ends of the LED string through the two respective connecting pins.

* * * * *